United States Patent
Shealy et al.

(10) Patent No.: US 11,652,469 B2
(45) Date of Patent: *May 16, 2023

(54) HIGH POWER BULK ACOUSTIC WAVE RESONATOR FILTER DEVICES

(71) Applicant: Akoustis, Inc., Huntersville, NC (US)

(72) Inventors: Jeffrey B. Shealy, Cornelius, NC (US); Shawn R. Gibb, Huntersville, NC (US); Rohan W. Houlden, Oak Ridge, NC (US); Joel M. Morgan, Denver, NC (US)

(73) Assignee: Akoustis, Inc., Huntersville, NC (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/552,999

(22) Filed: Aug. 27, 2019

(65) Prior Publication Data

US 2020/0067486 A1 Feb. 27, 2020

Related U.S. Application Data

(60) Provisional application No. 62/723,152, filed on Aug. 27, 2018.

(51) Int. Cl.
*H03H 9/54* (2006.01)
*H03H 9/17* (2006.01)
(Continued)

(52) U.S. Cl.
CPC ............... *H03H 9/54* (2013.01); *H03H 3/02* (2013.01); *H03H 9/02007* (2013.01); *H03H 9/125* (2013.01); *H03H 9/17* (2013.01)

(58) Field of Classification Search
CPC ......... H03H 9/02; H03H 9/02007; H03H 9/54
(Continued)

(56) References Cited

U.S. PATENT DOCUMENTS

| 5,231,327 A | 7/1993 | Ketcham |
| 5,894,647 A | 4/1999 | Lakin |

(Continued)

FOREIGN PATENT DOCUMENTS

| CN | 1929302 | 3/2007 |
| JP | H09321361 | 12/1997 |

(Continued)

OTHER PUBLICATIONS

International Search Report and Written Opinion for PCT/US2019/048412, dated Nov. 19, 2019.
(Continued)

*Primary Examiner* — Hafizur Rahman
(74) *Attorney, Agent, or Firm* — Richard T. Ogawa; Ogawa P.C.

(57) ABSTRACT

An acoustic resonator device and method thereof. The device includes a substrate member having an air cavity region. A piezoelectric layer is coupled to and configured overlying the substrate member and the air cavity region. The piezoelectric layer is configured to be characterized by an x-ray rocking curve Full Width at Half Maximum (FWHM) ranging from 0 degrees to 2 degrees. A top electrode is coupled to and configured overlying the piezoelectric layer, while a bottom electrode coupled to and configured underlying the piezoelectric layer within the air cavity region. The configuration of the materials of the piezoelectric layer and the substrate member to achieve the specific FWHM range improves a power handling capability characteristic and a power durability characteristic.

14 Claims, 6 Drawing Sheets

(51) Int. Cl.
  *H03H 3/02* (2006.01)
  *H03H 9/125* (2006.01)
  *H03H 9/02* (2006.01)

(58) Field of Classification Search
  USPC .......................................................... 333/186
  See application file for complete search history.

(56) References Cited

U.S. PATENT DOCUMENTS

| | | | |
|---|---|---|---|
| 6,051,907 A | 4/2000 | Ylilammi | |
| 6,114,635 A | 9/2000 | Lakin et al. | |
| 6,262,637 B1 | 7/2001 | Bradley et al. | |
| 6,377,137 B1 | 4/2002 | Ruby | |
| 6,384,697 B1 | 5/2002 | Ruby | |
| 6,472,954 B1 | 10/2002 | Ruby et al. | |
| 6,617,060 B2 | 9/2003 | Weeks, Jr. et al. | |
| 6,812,619 B1 | 11/2004 | Kaitila et al. | |
| 6,841,922 B2 | 1/2005 | Aigner et al. | |
| 6,864,619 B2 | 3/2005 | Aigner et al. | |
| 6,879,224 B2 | 4/2005 | Frank | |
| 6,909,340 B2 | 6/2005 | Aigner et al. | |
| 6,933,807 B2 | 8/2005 | Marksteiner et al. | |
| 7,112,860 B2 | 9/2006 | Saxler | |
| 7,250,360 B2 | 7/2007 | Shealy et al. | |
| 7,268,436 B2 | 9/2007 | Aigner et al. | |
| 7,365,619 B2 | 4/2008 | Aigner et al. | |
| 7,514,759 B1 | 4/2009 | Mehta et al. | |
| 7,777,777 B2 | 8/2010 | Bowman et al. | |
| 7,875,910 B2 | 1/2011 | Sheppard et al. | |
| 7,982,363 B2 | 7/2011 | Chitnis | |
| 8,304,271 B2 | 11/2012 | Huang et al. | |
| 8,405,285 B2 * | 3/2013 | Kobayashi | H01L 41/0973 310/358 |
| 2005/0255234 A1 | 11/2005 | Kanda et al. | |
| 2007/0080611 A1 | 4/2007 | Yamada et al. | |
| 2008/0024042 A1 | 1/2008 | Isobe et al. | |
| 2008/0284541 A1 | 11/2008 | Chitnis | |
| 2008/0284542 A1 * | 11/2008 | Sano | H03H 9/02149 333/187 |
| 2009/0033177 A1 | 2/2009 | Itaya et al. | |
| 2011/0114968 A1 | 5/2011 | Sheppard et al. | |
| 2012/0287575 A1 | 11/2012 | Nelson | |
| 2013/0176086 A1 | 7/2013 | Bradley et al. | |
| 2014/0132117 A1 | 5/2014 | Larson, III | |
| 2015/0079329 A1 * | 3/2015 | Schowalter | H01L 21/02389 428/64.1 |
| 2016/0028367 A1 | 1/2016 | Shealy | |
| 2016/0036580 A1 | 2/2016 | Shealy | |
| 2017/0264256 A1 | 9/2017 | Gibb et al. | |
| 2018/0275485 A1 * | 9/2018 | Hurwitz | H03H 9/605 |
| 2018/0323767 A1 * | 11/2018 | Then | H03H 9/562 |
| 2019/0199312 A1 * | 6/2019 | Dasgupta | H03H 9/587 |
| 2020/0067486 A1 * | 2/2020 | Shealy | H03H 9/54 |
| 2020/0091406 A1 * | 3/2020 | Shealy | H01L 41/18 |
| 2020/0343875 A1 * | 10/2020 | Shealy | H03H 9/568 |

FOREIGN PATENT DOCUMENTS

| | | |
|---|---|---|
| JP | 2009100197 | 5/2009 |
| JP | 2010068109 | 3/2010 |
| WO | WO2005034349 | 4/2005 |
| WO | WO2016122877 | 8/2016 |
| WO | WO2017171856 | 5/2017 |
| WO | WO2017222990 | 12/2017 |

OTHER PUBLICATIONS

International Search Report and Written Opinion for PCT/US2019/018550, dated May 30, 2019.
International Search Report and Written Opinion for PCT/US2018/050521, dated Jan. 28, 2019.
International Search Report and Written Opinion for PCT/US2015/034560, dated Sep. 18, 2015.
Office Action dated Sep. 17, 2018 for Chinese Application No. 201580042442.5.

* cited by examiner

| Piezoelectric layer | Layer Thickness (nm) | FWHM (Degrees) | FWHM (arcseconds) |
|---|---|---|---|
| Single crystal AlN-on-SiC | 500 | 0.03 | 101 |
| Single crystal AlN-on-<111>Si | 500 | 0.3 | 1084 |
| Polycrystalline AlN-on-Si | 500 | 2.26 | 8136 |
| Hybrid single crystal AlN-on-<111>Si | 500 | 0.74 | 2668 |

FIG. 2

| Source | Power (dBm) | Power (W) | Temp (C) | Modulation | Freq. (GHz) | Process | Avg. Max Power (dBm) |
|---|---|---|---|---|---|---|---|
| Single Crystal AlN | 36.9 | 4.9 | 25 | WCDMA | 5.2 | XBAW | 36.87 |
| Single Crystal AlN | 36.88 | 4.88 | 25 | WCDMA | 5.2 | XBAW | |
| Single Crystal AlN | 36.83 | 4.82 | 25 | WCDMA | 5.2 | XBAW | |
| Poly-Crystal AlN | 32.87 | 2.14 | 25 | WCDMA | 5.2 | XBAW | 33.11 |
| Poly-Crystal AlN | 33.35 | 2.16 | 25 | WCDMA | 5.2 | XBAW | |

HIGH POWER BULK ACOUSTIC WAVE RESONATOR FILTER DEVICES

CROSS-REFERENCES TO RELATED APPLICATIONS

The present application claims priority to and incorporates by reference, for all purposes, U.S. Provisional App. No. 62/723,152, titled "HIGH POWER BULK ACOUSTIC WAVE RESONATOR FILTER DEVICES," filed Aug. 27, 2018. The present application also incorporates by reference, for all purposes, the following patent applications, all commonly owned: U.S. patent application Ser. No. 14/298,057, titled "RESONANCE CIRCUIT WITH A SINGLE CRYSTAL CAPACITOR DIELECTRIC MATERIAL", filed Jun. 6, 2014, now U.S. Pat. No. 9,673,384; U.S. patent application Ser. No. 14/298,076, titled "METHOD OF MANUFACTURE FOR SINGLE CRYSTAL CAPACITOR DIELECTRIC FOR A RESONANCE CIRCUIT", filed Jun. 6, 2014, now U.S. Pat. No. 9,537,465; U.S. patent application Ser. No. 14/298,100, titled "INTEGRATED CIRCUIT CONFIGURED WITH TWO OR MORE SINGLE CRYSTAL ACOUSTIC RESONATOR DEVICES", filed Jun. 6, 2014, now U.S. Pat. No. 9,571,061; U.S. patent application Ser. No. 14/341,314, titled "WAFER SCALE PACKAGING", filed Jul. 25, 2014, now U.S. Pat. No. 9,805,966; U.S. patent application Ser. No. 14/449,001, titled "MOBILE COMMUNICATION DEVICE CONFIGURED WITH A SINGLE CRYSTAL PIEZO RESONATOR STRUCTURE", filed Jul. 31, 2014, now U.S. Pat. No. 9,716,581; U.S. patent application Ser. No. 14/469,503, titled "MEMBRANE SUBSTRATE STRUCTURE FOR SINGLE CRYSTAL ACOUSTIC RESONATOR DEVICE", filed Aug. 26, 2014, now U.S. Pat. No. 9,917,568; and U.S. patent application Ser. No. 15/068,510, titled "METHOD OF MANUFACTURE FOR SINGLE CRYSTAL ACOUSTIC RESONATOR DEVICES USING MICRO-VIAS," filed Mar. 11, 2016, now U.S. Pat. No. 10,217,930.

BACKGROUND OF THE INVENTION

The present invention relates generally to electronic devices. More particularly, the present invention provides techniques related to a method of manufacture and a structure for bulk acoustic wave resonator devices, single crystal bulk acoustic wave resonator devices, single crystal filter and resonator devices, and the like. Merely by way of example, the invention has been applied to a single crystal resonator device for a communication device, mobile device, computing device, among others.

Mobile telecommunication devices have been successfully deployed world-wide. Over a billion mobile devices, including cell phones and smartphones, were manufactured in a single year and unit volume continues to increase year-over-year. With ramp of 4G/LTE in about 2012, and explosion of mobile data traffic, data rich content is driving the growth of the smartphone segment—which is expected to reach 2B per annum within the next few years. Coexistence of new and legacy standards and thirst for higher data rate requirements is driving RF complexity in smartphones. Unfortunately, limitations exist with conventional RF technology that is problematic, and may lead to drawbacks in the future.

With 4G LTE and 5G growing more popular by the day, wireless data communication demands high performance RF filters with frequencies around 5 GHz and higher. Bulk acoustic wave resonators (BAWR) using crystalline piezoelectric thin films are leading candidates for meeting such demands. Current BAWRs using polycrystalline piezoelectric thin films are adequate for bulk acoustic wave (BAW) filters operating at frequencies ranging from 1 to 3 GHz; however, the quality of the polycrystalline piezoelectric films degrades quickly as the thicknesses decrease below around 0.5 um, which is required for resonators and filters operating at frequencies around 5 GHz and above. Single crystalline or epitaxial piezoelectric thin films grown on compatible crystalline substrates exhibit good crystalline quality and high piezoelectric performance even down to very thin thicknesses, e.g., 0.4 um. Even so, there are challenges to using and transferring single crystal piezoelectric thin films in the manufacture of BAWR and BAW filters.

From the above, it is seen that techniques for improving methods of manufacture and structures for acoustic resonator devices are highly desirable.

BRIEF SUMMARY OF THE INVENTION

According to the present invention, techniques generally related to electronic devices are provided. More particularly, the present invention provides techniques related to a method of manufacture and structure for bulk acoustic wave resonator devices, single crystal resonator devices, single crystal filter and resonator devices, and the like. Merely by way of example, the invention has been applied to a single crystal resonator device for a communication device, mobile device, computing device, among others.

In an example, the present invention provides an acoustic resonator device configured for improved power handling capability and power durability. The device includes a substrate member having an air cavity region. A piezoelectric layer is coupled to and configured overlying the substrate member and the air cavity region. The piezoelectric layer is configured to be characterized by an x-ray rocking curve Full Width at Half Maximum (FWHM) ranging from 0 degrees to 2 degrees. A top electrode is coupled to and configured overlying the piezoelectric layer, while a bottom electrode coupled to and configured underlying the piezoelectric layer within the air cavity region. The configuration of the materials of the piezoelectric layer and the substrate member to achieve the specific FWHM range improves a power handling capability characteristic and a power durability characteristic.

In an example, the present invention provides a method of fabricating an acoustic resonator device with improved power handling capability and power durability. The method can include providing a substrate member and forming an air cavity within a portion of the substrate member. A piezoelectric layer can be physically coupled to a substrate region of the substrate member and spatially configured overlying the substrate member and the air cavity. A top electrode can be formed overlying the piezoelectric layer and physically coupled to a top piezo surface region of the piezoelectric layer. Also, a bottom electrode can be formed underlying the piezoelectric layer and physically coupled to a bottom surface region of the piezoelectric layer. In a specific example, forming the piezoelectric layer includes forming a piezoelectric layer characterized by an x-ray rocking curve Full Width at Half Maximum (FWHM) ranging from 0 degrees to 2 degrees. The formation of the piezoelectric layer can include the configuration of the thickness and material composition of the piezoelectric layer to achieve the FWHM values ranging from 0 degrees to 2 degrees.

One or more benefits are achieved over pre-existing techniques using the invention. In particular, the present device can be manufactured in a relatively simple and cost effective manner while using conventional materials and/or methods according to one of ordinary skill in the art. The present device provides an ultra-small form factor RF resonator filter with high rejection, high power handling capability, high power durability, and low insertion loss. Such filters or resonators can be implemented in an RF filter device, an RF filter system, or the like. Depending upon the embodiment, one or more of these benefits may be achieved.

A further understanding of the nature and advantages of the invention may be realized by reference to the latter portions of the specification and attached drawings.

BRIEF DESCRIPTION OF THE DRAWINGS

In order to more fully understand the present invention, reference is made to the accompanying drawings. Understanding that these drawings are not to be considered limitations in the scope of the invention, the presently described embodiments and the presently understood best mode of the invention are described with additional detail through use of the accompanying drawings in which:

FIG. 2 is a table comparing acoustic resonator devices using different types of piezoelectric materials according to examples of the present invention.

DETAILED DESCRIPTION OF THE INVENTION

According to the present invention, techniques generally related to electronic devices are provided. More particularly, the present invention provides techniques related to a method of manufacture and structure for bulk acoustic wave resonator devices, single crystal resonator devices, single crystal filter and resonator devices, and the like. Merely by way of example, the invention has been applied to a single crystal resonator device for a communication device, mobile device, computing device, among others.

Figure 1:
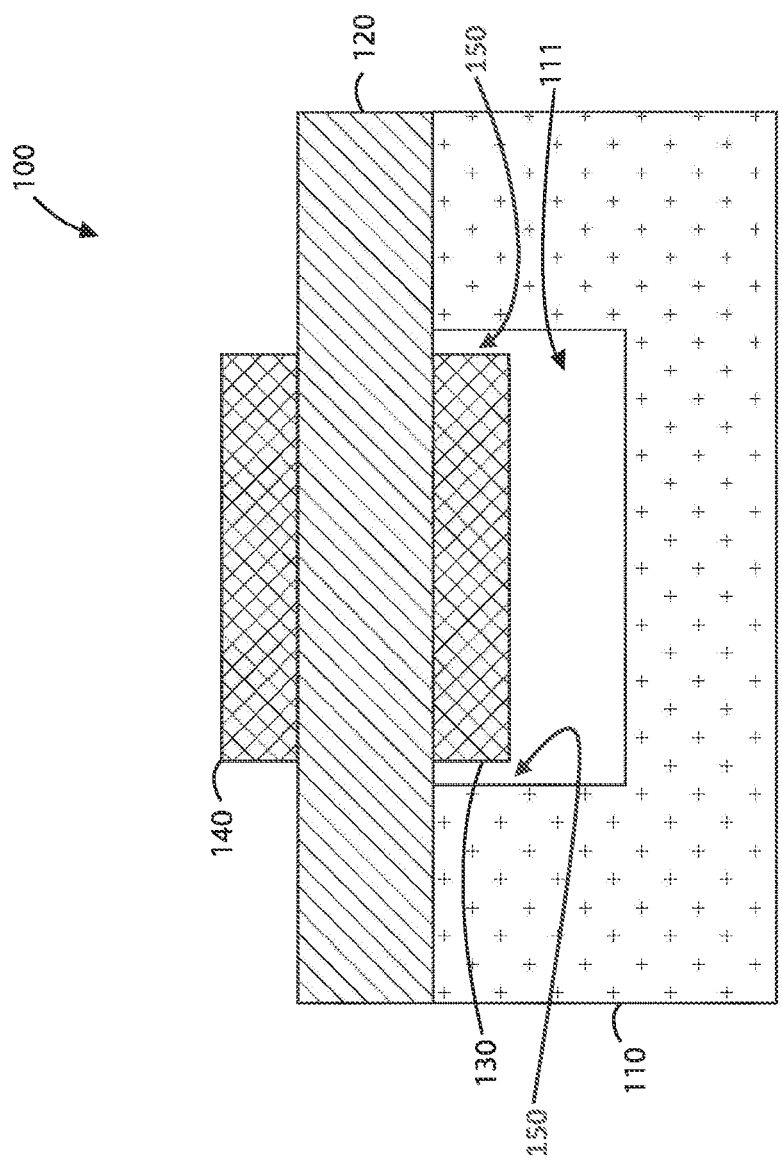
FIG. 1 is a simplified diagram illustrating an acoustic resonator device according to an example of the present invention.

FIG. 1 is a simplified diagram illustrating an acoustic resonator device according to an example of the present invention. As shown, device 100 includes a substrate member 110, a piezoelectric layer 120, a bottom electrode 130, and a top electrode 140. The substrate member 110 includes a substrate surface region and an air cavity region 111. The piezoelectric layer 120 is physically coupled to the substrate surface region and is spatially configured overlying the substrate member 110 and the air cavity region 111. The piezoelectric layer 120 also includes a top piezo surface region and a bottom piezo surface region. The bottom electrode 130 is spatially configured underlying the piezoelectric layer 120 and physically coupled to the bottom piezo surface region. As shown in FIG. 1, a gap 150 exists between the bottom electrode 130 and a portion of the substrate member 110. During fabrication, for example, the bottom electrode 130 can be patterned such that it is configured within the boundaries of the air cavity region 111 such that the bottom electrode 130 does not come in contact with one or more sidewalls of the substrate member 110. The top electrode 140 is spatially configured overlying the piezoelectric layer 120 and physically coupled to the top piezo surface region. Those of ordinary skill in the art will recognize other variations, modifications, and alternatives.

In an example, the substrate member 110 includes a silicon material, a silicon carbide (SiC) material, a <111> orientation silicon material, or the like. The substrate member 110 can also include other substrate materials known by those of ordinary skill in the art. The bottom and top electrodes 130, 140 can include common metal materials and alloys known by those of ordinary skill in the art.

In an example, the piezoelectric layer 120 can include a single crystal material, a hybrid single crystal material, or a polycrystalline material, or the like. The piezoelectric layer 120 can also include a substantially single crystal material, i.e., an essentially single crystal material. In a specific example, the piezoelectric layer 120 can include an aluminum nitride (AlN) material, or the like. Also, the piezoelectric layer 120 can be characterized by an x-ray rocking curve Full Width at Half Maximum (FWHM) ranging from 0 degrees to 2 degrees. In a specific example, the piezoelectric layer 120 can also be characterized by a layer thickness of 500 nm. Further, the layer thickness can be configured such that the piezoelectric layer 120 is characterized by an x-ray rocking curve FWHM ranging from 0 to 2 degrees. The configuration of the materials of the piezoelectric layer and the substrate member, including the layer thickness and materials, to achieve the x-ray rocking curve FWHM ranging from 0 to 2 degrees can improve a power handling capability characteristic and a power durability characteristic. Of course, there can be other variations, modifications, and alternatives as well.

In an example, the present invention provides a method of fabricating an acoustic resonator device. The method can include providing a substrate member and forming an air cavity within a portion of the substrate member. A piezoelectric layer can be physically coupled to a substrate region of the substrate member and spatially configured overlying the substrate member and the air cavity. A top electrode can be formed overlying the piezoelectric layer and physically coupled to a top piezo surface region of the piezoelectric layer. Also, a bottom electrode can be formed underlying the piezoelectric layer and physically coupled to a bottom surface region of the piezoelectric layer. In a specific example, forming the piezoelectric layer includes forming a piezoelectric layer characterized by an x-ray rocking curve Full Width at Half Maximum (FWHM) ranging from 0 degrees to 2 degrees. A thickness of the piezoelectric layer and material composition of the piezoelectric layer can be configured to achieve the FWHM values ranging from 0 degrees to 2 degrees. There can be other variations, modifications, and alternatives.

Examples of the present invention can be used on transmitter (Tx) and transceiver (Tx/Rx) applications. In a specific application, the device 100 can be configured in a Tx or Tx/Rx system where the acoustic wave RF filter is located after the power amplifier (PA). In this case, the RF filter must function and survive the full output power of the PA. Thus, power handling capability and power durability are key characteristics to optimize in such applications.

FIG. 2 is a table comparing acoustic resonator devices using different types of piezoelectric materials according to examples of the present invention. As shown, table 200 shows FWHM values in degrees and arcseconds for various types of piezoelectric material and substrate combinations at a piezoelectric layer thickness of 500 nm. The x-ray rocking curve FWHM parameter can depend on the combination of materials used for the piezoelectric layer and the substrate, as well as the thickness of these materials. Further, an FWHM profile is used to characterize material properties and surface integrity features, and is an indicator of crystal quality. The results of table 200 show that the acoustic resonator devices using single crystal materials exhibit a lower FWHM compared to devices using polycrystalline material, i.e., single crystal materials have a higher crystal quality.

Figures 3A, 3B:
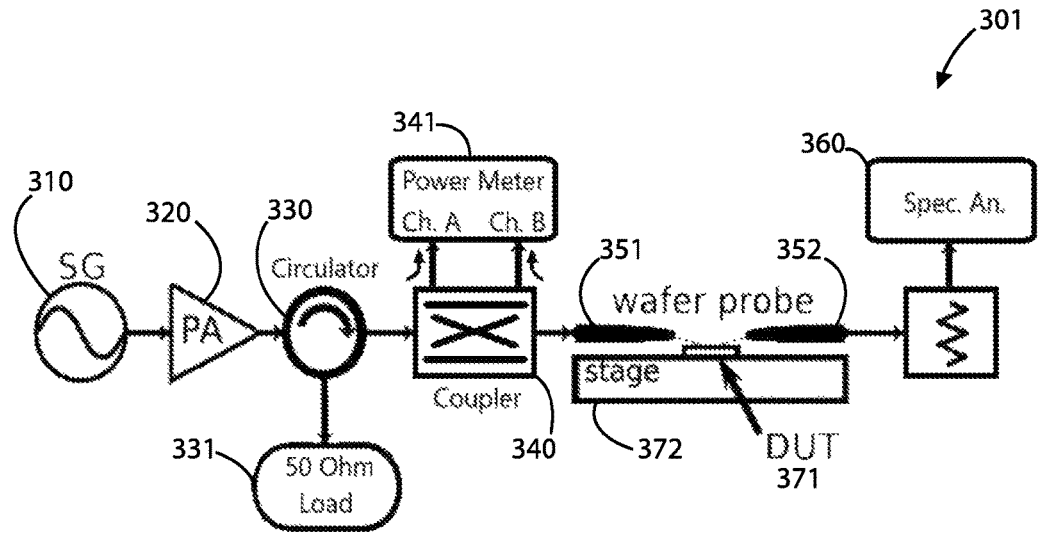
FIG. 3A is a simplified diagram illustrating a test vehicle setup using two acoustic resonator filter devices according to an example of the present invention.
FIG. 3B is a table comparing measurements of acoustic resonator devices according to various examples of the present invention using the test vehicle setup of FIG. 3A.

FIG. 3A is a simplified diagram illustrating a test vehicle setup using two acoustic resonator filter devices according to an example of the present invention. As shown, test vehicle 301 includes a signal generator 310 electrically coupled to a power amplifier 320, which is electrically coupled to a circulator 330. The circulator 330 is electrically coupled to a resistive load 331, which is a 50 Ohm load in this example. The circulator 330 is electrically coupled to a coupler 340, which is also electrically coupled to a power meter 341. In a specific example, the power meter 341 can include a first channel (shown in FIG. 3A as "Ch. A") and a second channel (shown in FIG. 3A as "Ch. B"). The test vehicle 301 can also include a pair of wafer probes 351, 352 configured such that the first wafer probe 351 is electrically coupled to the coupler 340 and the second wafer probe 352 is electrically coupled to a spectral analyzer 360. Using this test vehicle setup 301, a device under test (DUT) 371 is placed on a stage 372 and measured using the wafer probes 351, 352. The DUT 371 can include devices similar to those acoustic resonator devices discussed in reference to FIG. 1. In a specific example, the DUT 371 used in the test vehicle 301 includes two resonator element filter devices. Those of ordinary skill in the art will recognize other variations, modifications, and alternatives to this test vehicle setup.

FIG. 3B is a table comparing measurements of acoustic resonator devices according to various examples of the present invention using the test vehicle setup of FIG. 3A. As shown, table 302 includes power measurements for acoustic resonator devices using single crystal AlN and poly-crystal AlN. These measurements were taken at an operating temperature of 25 degrees Celsius and performed using a Wideband Code Division Multiple Access (WCDMA) modulation at 5.2 GHz. The acoustic resonator devices can be fabricated according to an XBAW stack process to form the device structure as shown in FIG. 1. According to these test results, acoustic resonator devices according to examples of the present invention using single crystal piezoelectric materials show about a 3.7 dB higher average max power handling characteristic compared to those examples using polycrystalline piezoelectric materials.

Figure 4:
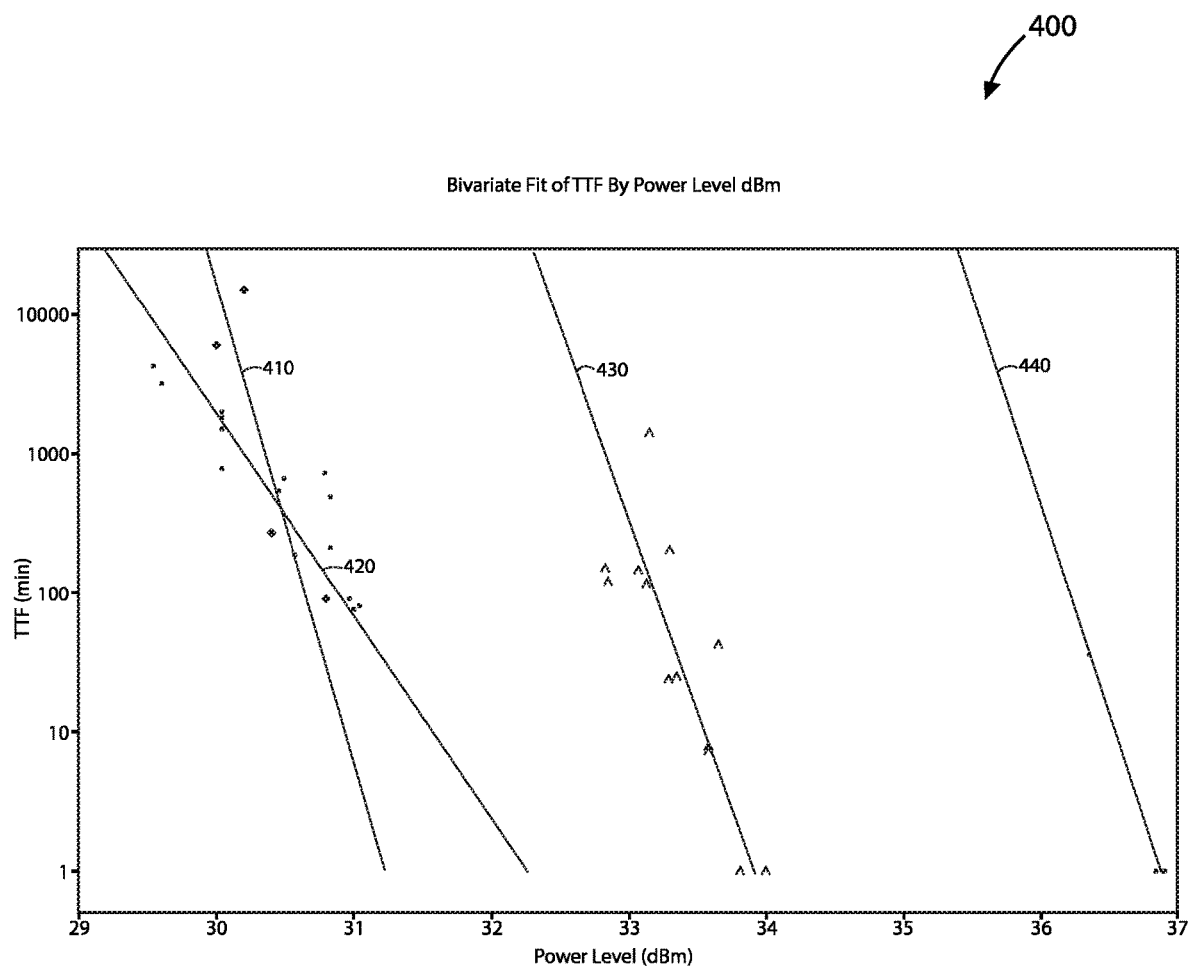
FIG. 4 is a simplified graph illustrating Time-To-Failure (TTF) versus power level for various acoustic resonator devices including examples according to the present invention.

FIG. 4 is a simplified graph illustrating Time-To-Failure (TTF) versus power level for various acoustic resonator devices including examples according to the present invention. As shown, graph 400 includes curves approximating measurements for four devices. Generally, TTF decreases with increasing power drive. Curve 410 represents measurements for a thin-film bulk acoustic wave resonator (FBAR) device using polycrystalline AlN, tested at 70 degrees Celsius and at a frequency of 5 GHz. Curve 420 represents measurements for a surface acoustic resonator (SAW) device using a lithium tantalate (LiTaO$_3$) material, tested at room temperature and at a frequency of 2 GHz. Curve 430 represents an acoustic resonator device according to an example of the present invention using polycrystalline AlN, tested at room temperature and at a frequency of 5.2 GHz. Curve 440 represents an acoustic resonator device according to an example of the present invention using single crystal AlN, tested at room temperature and at a frequency of 5.2 GHz. These results show improved TTF for devices according to present examples using single crystal materials versus poly-crystal materials.

Figure 5:
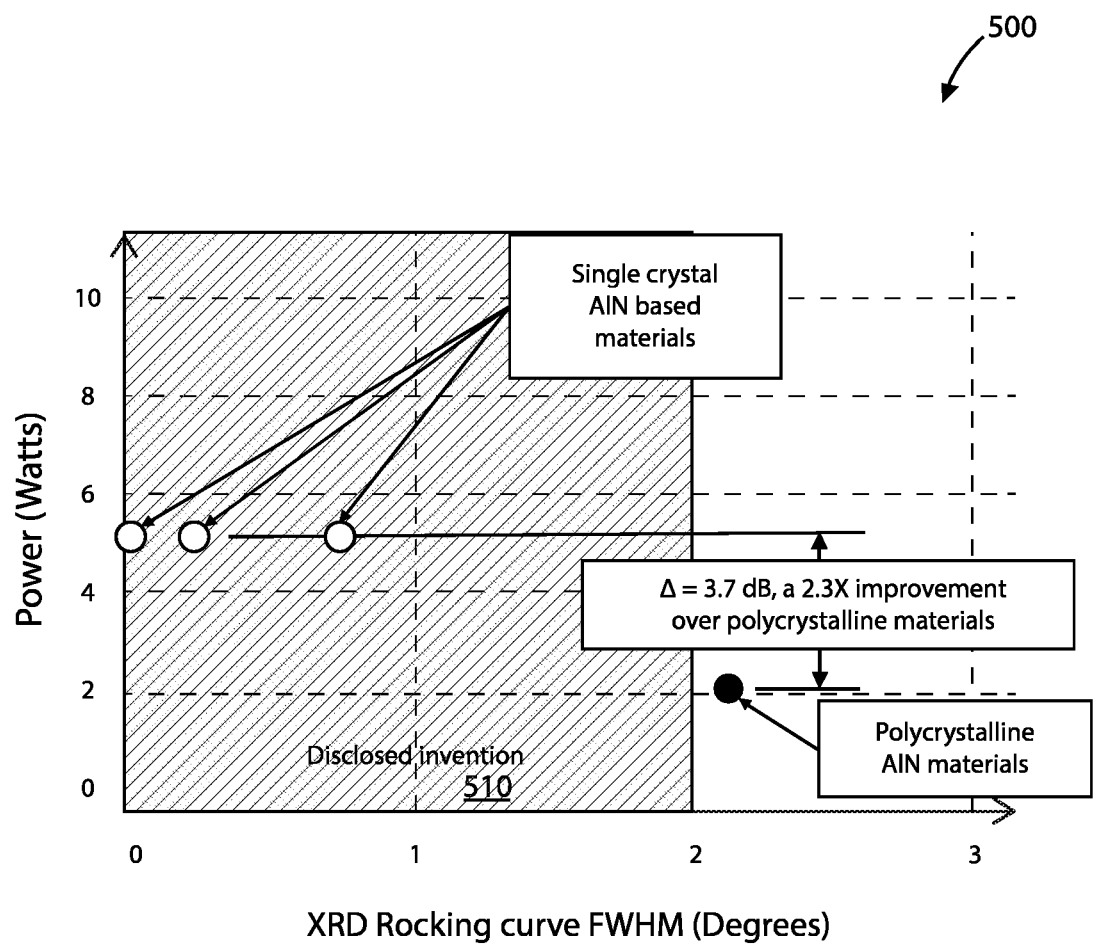
FIG. 5 is a simplified graph illustrating power handling capability versus x-ray diffraction (XRD) rocking curve full width at half-maximum (FWHM) according to examples of the present invention.

FIG. 5 is a simplified graph illustrating power handling capability versus x-ray diffraction (XRD) rocking curve full width at half-maximum (FWHM) according to examples of the present invention. As shown, graph 500 includes measurements for acoustic resonator devices according to examples of the present invention that use single crystal AlN based materials and examples that use polycrystalline AlN materials. These results show that single crystal AlN based materials exhibit a 2.3 times improvement over polycrystalline AlN based materials for power handling capability. As discussed above, the piezoelectric materials can be configured with XRD FWHM values up to 2 degrees in width, shown by region 510, for improved power handling capability and power durability.

Figure 6A:
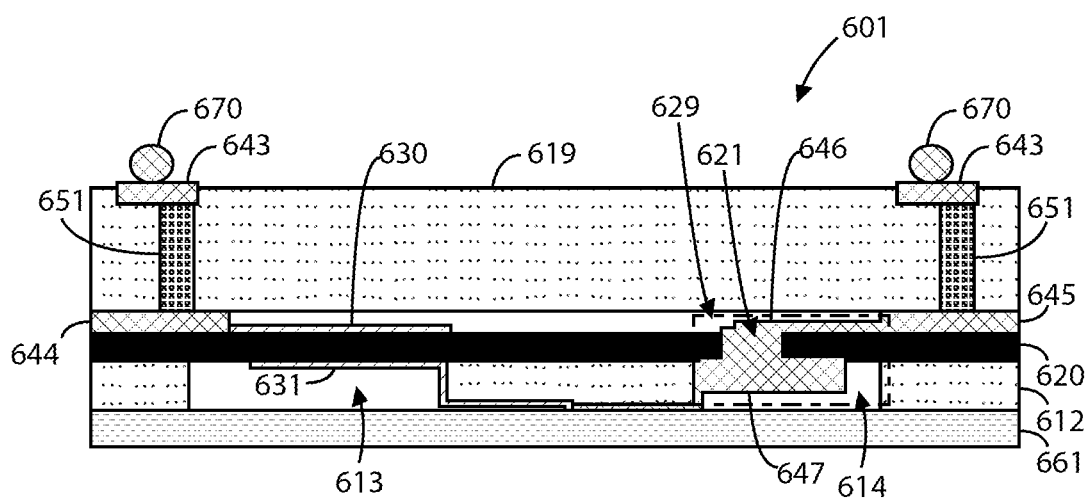
FIG. 6A is a simplified diagram illustrating an acoustic resonator device having topside interconnections according to an example of the present invention.

FIG. 6A is a simplified diagram illustrating an acoustic resonator device 601 having topside interconnections according to an example of the present invention. As shown, device 601 includes a thinned seed substrate 612 with an overlying single crystal piezoelectric layer 620, which has a micro-via 629. The micro-via 629 can include a topside micro-trench 621, a topside metal plug 646, a backside trench 614, and a backside metal plug 647. Although device 601 is depicted with a single micro-via 629, device 601 may have multiple micro-vias. A topside metal electrode 630 is formed overlying the piezoelectric layer 620. A top cap structure is bonded to the piezoelectric layer 620. This top cap structure includes an interposer substrate 619 with one or more through-vias 651 that are connected to one or more top bond pads 643, one or more bond pads 644, and topside metal 645 with topside metal plug 646. Solder balls 670 are electrically coupled to the one or more top bond pads 643.

The thinned substrate 612 has the first and second backside trenches 613, 614. A backside metal electrode 631 is formed underlying a portion of the thinned seed substrate 612, the first backside trench 613, and the topside metal electrode 630. The backside metal plug 647 is formed underlying a portion of the thinned seed substrate 612, the second backside trench 614, and the topside metal 645. This backside metal plug 647 is electrically coupled to the topside metal plug 646 and the backside metal electrode 631. A backside cap structure 661 is bonded to the thinned seed substrate 612, underlying the first and second backside trenches 613, 614.

Figure 6B:
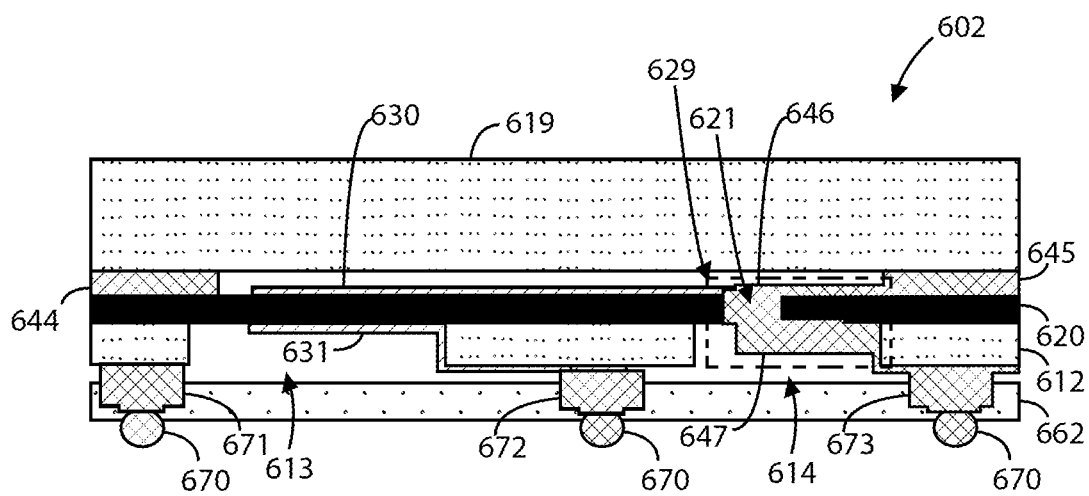
FIG. 6B is a simplified diagram illustrating an acoustic resonator device having bottom-side interconnections according to an example of the present invention.

FIG. 6B is a simplified diagram illustrating an acoustic resonator device 602 having backside interconnections according to an example of the present invention. As shown, device 601 includes a thinned seed substrate 612 with an overlying piezoelectric layer 620, which has a micro-via 629. The micro-via 629 can include a topside micro-trench 621, a topside metal plug 646, a backside trench 614, and a backside metal plug 647. Although device 602 is depicted with a single micro-via 629, device 602 may have multiple micro-vias. A topside metal electrode 630 is formed overlying the piezoelectric layer 620. A top cap structure is bonded to the piezoelectric layer 620. This top cap structure 619 includes bond pads which are connected to one or more bond pads 644 and topside metal 645 on piezoelectric layer 620. The topside metal 645 includes a topside metal plug 646.

The thinned substrate 612 has the first and second backside trenches 613, 614. A backside metal electrode 631 is formed underlying a portion of the thinned seed substrate 612, the first backside trench 613, and the topside metal electrode 630. A backside metal plug 647 is formed underlying a portion of the thinned seed substrate 612, the second backside trench 614, and the topside metal plug 646. This backside metal plug 647 is electrically coupled to the topside metal plug 646. A backside cap structure 662 is bonded to the thinned seed substrate 612, underlying the first and second backside trenches. One or more backside bond pads (671, 672, 673) are formed within one or more portions of the backside cap structure 662. Solder balls 670 are electrically coupled to the one or more backside bond pads 671-673.

In an example, the device includes a seed substrate with a piezoelectric layer formed overlying. In a specific example, the seed substrate can include silicon, silicon carbide, aluminum oxide, or single crystal aluminum gallium nitride materials, or the like. The piezoelectric layer can include a piezoelectric single crystal layer or a thin film piezoelectric single crystal layer.

In a specific example, the topside metal electrode can include a molybdenum, aluminum, ruthenium, or titanium material, or the like and combinations thereof. This layer can be deposited and patterned on top of the piezoelectric layer by a lift-off process, a wet etching process, a dry etching process, a metal printing process, a metal laminating process, or the like. The lift-off process can include a sequential process of lithographic patterning, metal deposition, and lift-off steps to produce the topside metal layer. The wet/dry etching processes can includes sequential processes of metal deposition, lithographic patterning, metal deposition, and metal etching steps to produce the topside metal layer. Those of ordinary skill in the art will recognize other variations, modifications, and alternatives.

This topside micro-trench can serve as the main interconnect junction between the top and bottom sides of the acoustic membrane, which will be developed in later method steps. In an example, the topside micro-trench is extends all the way through the piezoelectric layer and stops in the seed substrate. This topside micro-trench can be formed through a dry etching process, a laser drilling process, or the like.

In an example, a laser drill can be used to form nominal 50 um holes, or holes between 10 um and 500 um in diameter, through the piezoelectric layer and stop in the seed substrate below the interface between these layers. A protective layer can be formed overlying the piezoelectric layer and the topside metal electrode. This protective layer can serve to protect the device from laser debris and to provide a mask for the etching of the topside micro-via. In a specific example, the laser drill can be an 11W high power diode-pumped UV laser, or the like. This mask can be subsequently removed before proceeding to other steps. The mask may also be omitted from the laser drilling process, and air flow can be used to remove laser debris.

In an example, a lithographic masking layer can be forming overlying the piezoelectric layer and the topside metal electrode. The topside micro-trench can be formed by exposure to plasma, or the like.

In an example, the topside metal can include a topside metal plug formed within the topside micro-trench. In a specific example, the topside metal plug fills the topside micro-trench to form a topside portion of a micro-via.

In an example, the bond pads and the topside metal can include a gold material or other interconnect metal material depending upon the application of the device. These metal materials can be formed by a lift-off process, a wet etching process, a dry etching process, a screen-printing process, an electroplating process, a metal printing process, or the like. In a specific example, the deposited metal materials can also serve as bond pads for a cap structure, which will be described below.

In an example, a top cap structure is positioned above the partially processed acoustic resonator device as described in the previous figures. The top cap structure can be formed using an interposer substrate in two configurations: fully processed interposer version (through glass via) and partially processed interposer version (blind via version). In the first version, the interposer substrate includes through-via structures that extend through the interposer substrate and are electrically coupled to the bottom bond pads and the top bond pads. In the second version, the interposer substrate includes blind via structures that only extend through a portion of the interposer substrate from the bottom side. These blind via structures are also electrically coupled to bottom bond pads. In a specific example, the interposer substrate can include a silicon, glass, smart-glass, or other like material.

In an example, the interposer substrate is bonded to the piezoelectric layer by the bond pads and the topside metal. This bonding process can be done using a compression bond method or the like. In an example, this substrate thinning process can include grinding and etching processes or the like. In a specific example, this process can include a wafer backgrinding process followed by stress removal, which can involve dry etching, CMP polishing, or annealing processes.

In an example, the first backside trench can be formed within the thinned seed substrate and underlying the topside metal electrode. The second backside trench can be formed within the thinned seed substrate and underlying the topside micro-trench and the topside metal plug. In a specific example, these trenches can be formed using deep reactive ion etching (DRIE) processes, Bosch processes, or the like. The size, shape, and number of the trenches may vary with the design of the acoustic resonator device. In various examples, the first backside trench may be formed with a trench shape similar to a shape of the topside metal electrode or a shape of the backside metal electrode. The first backside trench may also be formed with a trench shape that is different from both a shape of the topside metal electrode and the backside metal electrode.

In an example, the backside metal electrode can be formed underlying one or more portions of the thinned substrate, within the first backside trench, and underlying the topside metal electrode. This process completes the resonator structure within the acoustic resonator device. The backside metal plug can be formed underlying one or more portions of the thinned substrate, within the second backside trench, and underlying the topside micro-trench. The backside metal plug can be electrically coupled to the topside metal plug and the backside metal electrode. In a specific example, the backside metal electrode can include a molybdenum, aluminum, ruthenium, or titanium material, or the like and combinations thereof. The backside metal plug can include a gold material, low resistivity interconnect metals, electrode metals, or the like. These layers can be deposited using the deposition methods described previously.

In an example, the backside cap structure is a dry film cap, which can include a permanent photo-imageable dry film such as a solder mask, polyimide, or the like. Bonding this cap structure can be cost-effective and reliable, but may not produce a hermetic seal. In another example, the backside cap structure is a substrate, which can include a silicon, glass, or other like material. Bonding this substrate can provide a hermetic seal, but may cost more and require additional processes. Depending upon application, either of these backside cap structures can be bonded underlying the first and second backside vias.

While the above is a full description of the specific embodiments, various modifications, alternative constructions and equivalents may be used. As an example, the packaged device can include any combination of elements described above, as well as outside of the present specification. Therefore, the above description and illustrations should not be taken as limiting the scope of the present invention which is defined by the appended claims.

What is claimed is:

1. An acoustic resonator device, the device comprising:
   a substrate member having a substrate surface region and an air cavity region defined by one or more substrate sidewalls;
   a piezoelectric layer configured overlying the substrate member and the air cavity region, the piezoelectric layer being physically coupled to the substrate surface region, and the piezoelectric layer having a top piezo surface region and a bottom piezo surface region,
   wherein the piezoelectric layer includes a topside micro-trench, a topside metal plug within the topside micro-trench, a backside trench, and a backside metal plug within the backside trench and coupled to the topside metal plug;
   wherein the topside micro-trench, the topside metal plug, the backside trench and the backside metal plug form a micro-via;
   wherein the piezoelectric layer is characterized by an x-ray rocking curve Full Width at Half Maximum (FWHM) ranging from 0 degrees to 2 degrees;
   a top electrode configured overlying the piezoelectric layer and physically coupled to the top piezo surface region; and
   a bottom electrode configured underlying the piezoelectric layer and physically coupled to the bottom piezo surface region and the backside metal plug, the bottom electrode being configured within the air cavity region.

2. The device of claim 1 wherein the substrate member includes a silicon material, a silicon carbide material, or a <111> orientation silicon material.

3. The device of claim 1 wherein the piezoelectric layer includes aluminum nitride (AlN).

4. The device of claim 1 wherein the piezoelectric layer includes a single crystal material, a substantially single crystal material, a hybrid single crystal material, or a polycrystalline material.

5. The device of claim 1 wherein the piezoelectric layer is characterized by a layer thickness of 500 nm.

6. The device of claim 1 wherein the piezoelectric layer is characterized by a layer thickness configured such that the piezoelectric layer is characterized by the x-ray rocking curve Full Width at Half Maximum (FWHM) ranging from 0 degrees to 2 degrees.

7. The device of claim 1 wherein the piezoelectric layer is characterized by the x-ray rocking curve Full Width at Half Maximum (FWHM) ranging from 0 degrees to 2 degrees to improve a power handling capability characteristic and a power durability characteristic.

8. A method of fabricating an acoustic resonator device, the method comprising:
   providing a substrate member having a substrate surface region;
   forming an air cavity within a portion of the substrate member;
   forming a backside trench within a portion of the substrate member;
   forming a piezoelectric layer physically coupled to the substrate surface region and overlying the substrate member and the air cavity region, the piezoelectric layer having a top piezo surface region and a bottom piezo surface region,
   wherein forming the piezoelectric layer includes forming a piezoelectric layer characterized by an x-ray rocking curve Full Width at Half Maximum (FWHM) ranging from 0 degrees to 2 degrees;
   forming a topside micro-trench within a portion of the piezoelectric layer overlying the backside trench;
   forming a topside metal plug within the topside micro-trench;
   forming a top electrode overlying the piezoelectric layer and physically coupled to the top piezo surface region;
   forming a backside metal plug within the backside trench and coupled to the topside metal plug;
   wherein the topside micro-trench, the topside metal plug, the backside trench, and the backside metal plug form a micro-via; and
   forming a bottom electrode underlying the piezoelectric layer within the air cavity region and physically coupled to the bottom piezo surface region and the backside metal plug.

9. The method of claim 8 wherein providing the substrate member includes providing the substrate member including a silicon material, a silicon carbide material, or a <111> orientation silicon material.

10. The method of claim 8 wherein forming the piezoelectric layer includes forming the piezoelectric layer including an aluminum nitride (AlN).

11. The method of claim 8 wherein forming the piezoelectric layer includes forming the piezoelectric layer including a single crystal material, a substantially single crystal material, a hybrid single crystal material, or a polycrystalline material.

12. The method of claim 8 wherein forming the piezoelectric layer includes forming the piezoelectric layer characterized by a layer thickness of 500 nm.

13. The method of claim 8 wherein forming the piezoelectric layer includes forming a piezoelectric layer characterized by a layer thickness configured such that the piezoelectric layer is characterized by the x-ray rocking curve Full Width at Half Maximum (FWHM) ranging from 0 degrees to 2 degrees.

14. The method of claim 8 wherein forming the piezoelectric layer includes forming the piezoelectric layer characterized by the x-ray rocking curve Full Width at Half Maximum (FWHM) ranging from 0 degrees to 2 degrees to improve a power handling capability characteristic and a power durability characteristic.

\* \* \* \* \*